(12) United States Patent
Bae et al.

(10) Patent No.: US 6,531,388 B2
(45) Date of Patent: Mar. 11, 2003

(54) METHOD OF FORMING AN ALUMINUM FILM FOR USE IN MANUFACTURING A SEMICONDUCTOR DEVICE

(75) Inventors: Jong-Yong Bae, Seoul (KR); Seung-Hwan Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/201,784

(22) Filed: Jul. 25, 2002

(65) Prior Publication Data

US 2003/0022491 A1 Jan. 30, 2003

(30) Foreign Application Priority Data

Jul. 26, 2001 (KR) ........................................ 2001-45063

(51) Int. Cl.[7] ........................................... H01L 21/4763
(52) U.S. Cl. ........................................ 438/636; 438/688
(58) Field of Search ................................... 438/636, 688

(56) References Cited

U.S. PATENT DOCUMENTS 5,019,533 A * 5/1991 Cuddihy et al. ............ 437/199
5,814,556 A * 9/1998 Wee et al. .................. 438/688
5,843,842 A * 12/1998 Lee et al. ................... 438/688

* cited by examiner

Primary Examiner—John F. Niebling
Assistant Examiner—Lynne Gurley
(74) Attorney, Agent, or Firm—Volentine Francos, PLLC

(57) ABSTRACT

A method of manufacturing a semiconductor device is capable of preventing a local delamination at the interface between an aluminum film and an anti-reflective layer formed thereon. After aluminum is deposited on a substrate, the aluminum film is slowly cooled. Then, the substrate is left as is for more than 3 minutes before a venting process takes place in which thermal energy is generated. Then, an anti-reflective layer is formed on the aluminum film. Thermal stress in the aluminum film is relieved by the slow cooling of the aluminum film and the delay before the venting process. Accordingly, when a thermal process is carried out after the anti-reflective layer is formed on the aluminum film, little shear stress is generated at the interface between the aluminum film and the anti-reflective layer.

23 Claims, 8 Drawing Sheets

METHOD OF FORMING AN ALUMINUM FILM FOR USE IN MANUFACTURING A SEMICONDUCTOR DEVICE

BACKGROUND OF THE INVENTION

1. Field of the Invention

The present invention relates to a method of manufacturing a semiconductor device. More particularly, the present invention relates to a method of forming an aluminum film on a semiconductor substrate and atop which film an anti-reflective layer is to be formed.

2. Description of the Related Art

As semiconductor devices become more highly integrated, the wiring patterns of the devices are becoming finer. In addition, an RC delay caused by the wiring is known to be the main characteristic of a semiconductor device that determines the operating speed of the device. For this reason, a multi-layer wiring structure is widely used. An aluminum film, to which a small amount of silicon (Si) or copper (Cu) is added, is used to form the multi-layer wiring structure. Specifically, the aluminum is sputtered onto a semiconductor wafer to fill a contact hole or a via hole and thereby form a metal wiring layer.

Subsequently, the metal wiring layer must be patterned. However, the desired pattern can not be formed by a projection exposure method if a photosensitive resin, such as photoresist, were deposited directly on the aluminum film, because aluminum is highly reflective. The exposure light would reflect from the aluminum film causing a metal bridge to form between wirings particularly in a stepped area. This problem is referred to as a "notching phenomenon". In order to solve this problem, dye has been added to the photoresist to reduce the influence of the reflected light. However, this technique compromises the microscopic processing quality, and so it is not adopted in cases where a fine wiring structure is desired.

On the other hand, another technique for obviating the notching phenomenon resides in forming an anti-reflective layer on the aluminum film and using a typical photoresist film having a superior microscopic processing quality. The anti-reflective layer has a low degree of reflectivity with respect to the exposure light. In this respect, a layer of titanium nitride (TiN) has been mainly used as the anti-reflective layer.

A multi-chamber physical vapor deposition apparatus is the most widely used apparatus for forming an aluminum film on a semiconductor wafer. Hereinafter, a method of depositing aluminum using a multi-chamber physical vapor deposition apparatus will be described with reference to FIG. 1.

Figure 1:
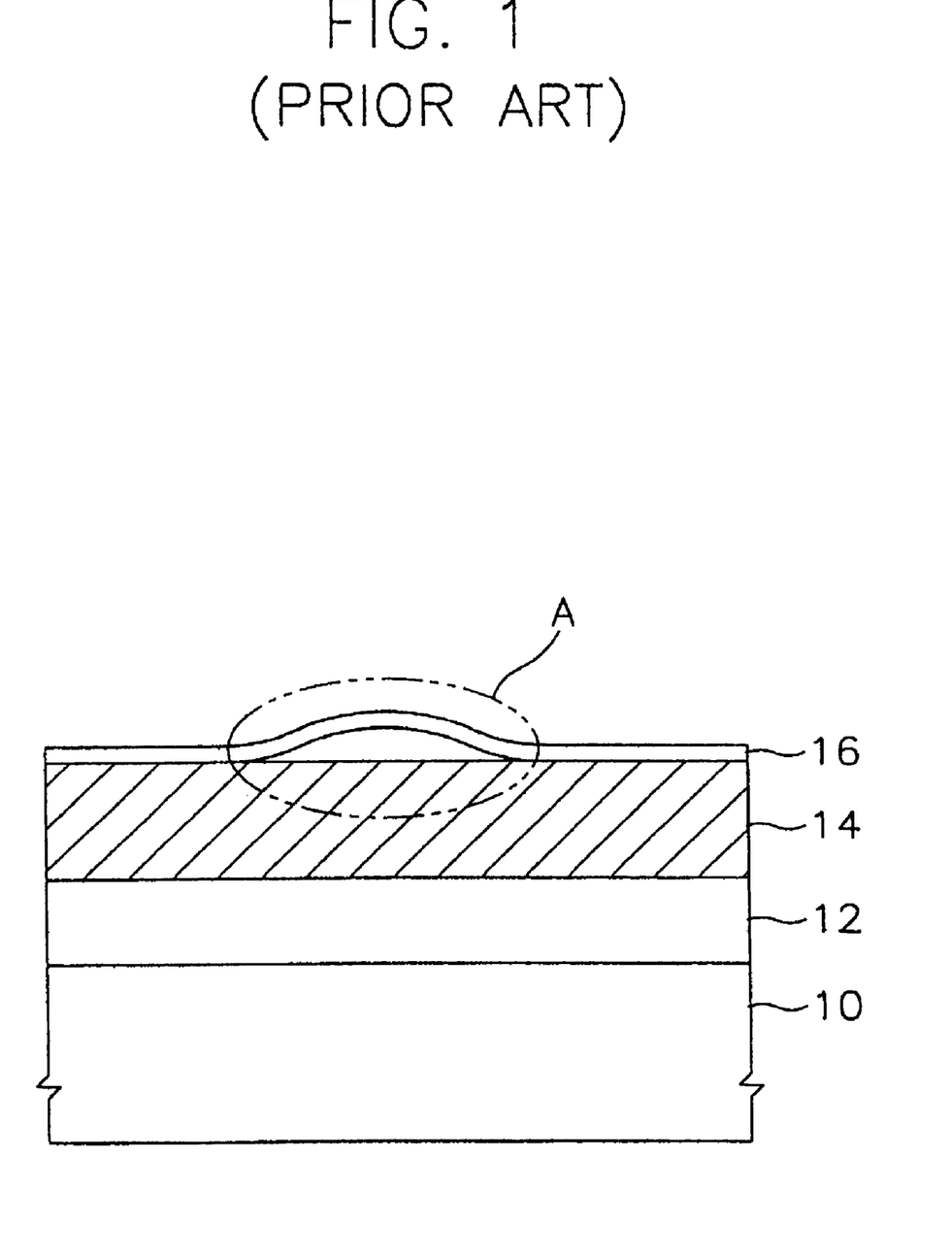
FIG. 1 is a sectional view of a wafer showing a conventional method of forming an aluminum film.

Referring to FIG. 1, a lot comprising 25 or 26 sheets of silicon wafers is loaded in a cassette of a loadlock chamber. Then, the pressure in the loadlock chamber is reduced until a vacuum is maintained in the loadlock chamber. Thereafter, a wafer 10 coated with an insulating layer 12 is moved from the loadlock chamber into an RF-etching chamber wherein an etching process is performed to remove impurities from the wafer.

Next, the wafer 10 is conveyed into a reaction chamber, that is a PVD chamber. In the PVD chamber, an aluminum film 14 is formed on the wafer by a sputtering method. The aluminum fills a contact hole or a via hole (not shown).

Then, the pressure in the PVD chamber is reduced and the wafer is moved into a cooling chamber. Thereafter, cooling water and cooling gas, such as argon (Ar), are injected into the cooling chamber so that the wafer is simultaneously water-cooled and air-cooled. Then, the wafer 10 is returned to the cassette of the loadlock chamber.

Once all wafers have been returned to the cassette of the loadlock chamber, a venting process is carried out whereupon the wafers may be unloaded. That is, vent gas, such as nitrogen ($N_2$) or argon (Ar), is supplied into the loadlock chamber through a vent line connected to the loadlock chamber until the pressure of the loadlock chamber reaches 760 Torr, whereupon the wafers are removed from the PVD chamber.

In the above-described aluminum deposition process, the stress on the aluminum film varies depending on the material of the cassette in which the wafers are stored. The cassette has 25 or 26 slots in which the wafers are received, respectively, and is mainly made of polypropylene (hereinafter, referred to as "PP") or polybutylene terephtalate (hereinafter, referred to as "PBT").

Figure 2:
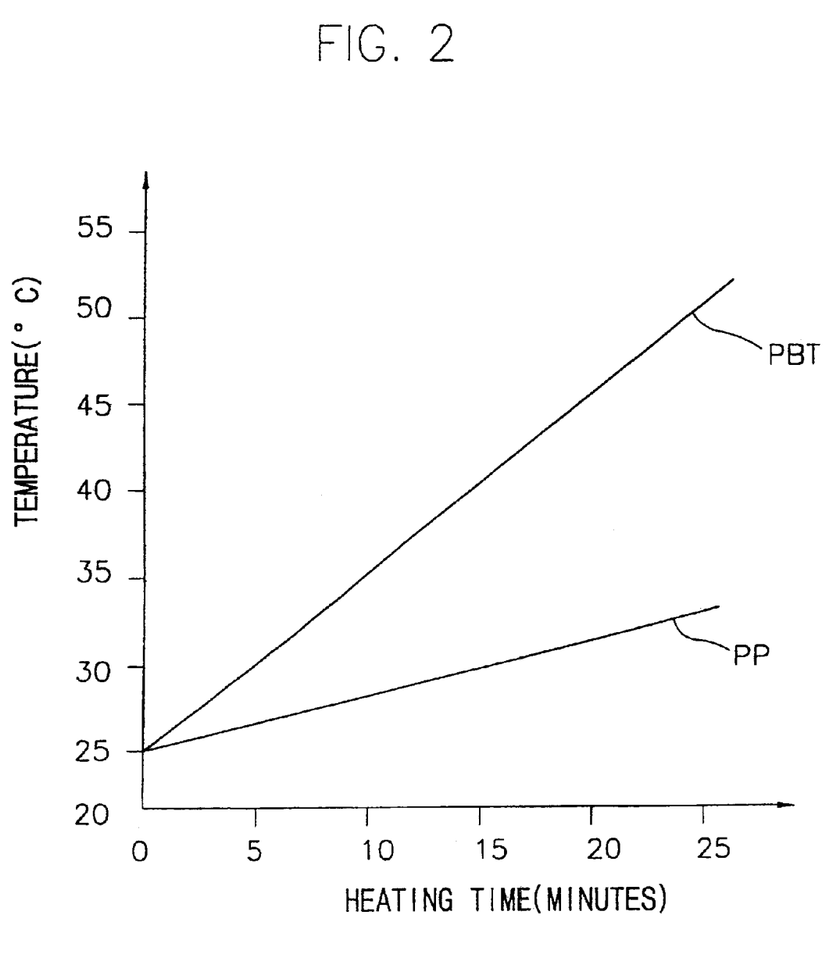
FIG. 2 is a graph showing the thermal conductivity of cassettes made of polypropylene and polybutylene terephtalate, respectively.

FIG. 2 is a graph showing the difference in thermal conductivity according to the cassette material. The temperature of a hot plate on which the cassettes are placed is set to 100° C. The surface temperature of the cassettes on the hot plate was measured over time. The thermal conductivity of the cassette is thus the gradient of the curve of the change in temperature over time. As shown in FIG. 2, a cassette made of PP has a thermal conductivity of 0.3° C./min. On the contrary, a cassette made of PBT has a thermal conductivity of 1.2° C./min, or one that is four times that of a PP cassette.

In the above-described aluminum deposition process, when the PP cassette is used, the venting process is carried out just after the wafer in the last slot has been conveyed into the loadlock chamber. Consequently, the wafer from the last slot is cooled relatively fast compared to the other wafers. Therefore, the stress on this last wafer is relatively high. More specifically, a thin film has an intrinsic stress according to deposition conditions, such as the temperature and pressure. When the cooling process is carried out after the deposition process, the thin film and an underlying layer experience different degrees of thermal expansion, whereby the thin film is subject to thermal stress. Therefore, a rapidly cooled aluminum film is subject to a high level of stress.

Still further, the aluminum film 14 as shown in FIG. 1 is subject to a large amount of thermal stress caused due to differences in thermal expansion between the aluminum film 14 and the underlying insulating interlayer 12. At the same time, the aluminum film 14 is subject to tensile stress created by the anti-reflective layer 16 formed thereon. When these stresses are applied to the aluminum film 14, the aluminum film 14 undergoes plastic deformation. The stresses are relieved to some extent because aluminum is a relatively soft material. On the contrary, the titanium nitride layer is a relatively hard material. Accordingly, when the aluminum film 14 undergoes a thermal cycle, from the cooling process to the succeeding process in which an anti-reflective layer 16 comprising titanium nitride (TiN) is formed thereon, shear stress occurs at the interface between the aluminum film 14 and the anti-reflective layer 16. If the value of the shear stress exceeds a critical value, the TiN anti-reflective layer 16 is locally delaminated from the aluminum film 14, which defect is referred to as a "ball defect" (as seen at "A" in FIG. 1).

When the PBT cassette is used, all of the wafers returned to the cassette are rapidly cooled, and not just the last wafer, because the cassette has a high degree of thermal conductivity, i.e., a thermal conductivity that is four times that of the PP cassette. Therefore, all of the wafers are subject to high levels of stress. Accordingly, ball defects are produced in all of the wafers after a TiN anti-reflective layer is formed thereon.

SUMMARY OF THE INVENTION

Therefore, an object of the present invention is to obviate the above-described problems of the prior art. More specifically, an object of the present invention to provide a method of manufacturing a semiconductor device, which prevents a ball defect from occurring at the interface between an aluminum film and an anti-reflective layer formed thereon.

To achieve this object, aluminum is deposited on a substrate and then slowly cooled. The slow cooling is carried out to relieve the thermal stress in the aluminum film. Typically, the thermal stress is produced when the aluminum film is subjected to a reflow process. At least part of the slow cooling process is a forced cooling of the aluminum film, and preferably also includes holding the substrate for a predetermined period of time in the cooling chamber before the forced cooling begins. The substrate is then left as is for more than 3 minutes (passive cooling), and then an anti-reflective layer is deposited on the aluminum film. The time delay of more than 3 minutes facilitates an additional cooling of the film further that relieves the thermal stress and ensures that any heating of the aluminum film from this point on will not significantly oxidize the surface of the film before the anti-reflective layer is formed thereon.

This method is particularly well-adapted for execution by a physical vapor deposition apparatus. According to this aspect of the invention, the substrate is conveyed into a reaction chamber of the apparatus. After the aluminum is deposited on the substrate to form the aluminum film, the substrate is conveyed into a cooling chamber. There, the aluminum film is cooled slowly. The substrate is then conveyed into a (cassette in a) loadlock chamber where the substrate is left as is for more than 3 minutes. Then, the loadlock chamber is vented by injecting a vent gas (inert) into the loadlock chamber, whereupon the substrate is unloaded.

The substrate can then be further processed to form a wiring pattern. According to this aspect of the present invention, an anti-reflective coating (ARC), preferably an anti-reflective TiN layer, is formed on the aluminum film. Next, the substrate is subjected to a photolithography process, known per se, to pattern the anti-reflective TiN layer and the underlying aluminum film. In this case, an insulating layer having a contact hole or a via therein may be provided on the substrate. Also, a barrier metal layer, preferably a Ti layer, is provided on the insulating layer.

According to the present invention, the rate at which the aluminum film is cooled to a given temperature in the cooling chamber is lower than in the prior art. Also, cooling the aluminum layer slowly in the cooling chamber after the reflow process, in particular, allows for a long time in which TiAl$_3$ crystals may be created at the interface between the aluminum film and the underlying titanium barrier metal layer. The TiAl$_3$ will act as a buffer layer between the silicon oxide of the insulating layer and the aluminum film.

Thus, the stress of the aluminum film is sufficiently relieved so much so that the heat transfer between the substrate and material of the cassette does not affect the outcome of the process. Accordingly, when a succeeding thermal process is carried out after the anti-reflective layer is formed on the aluminum film, little shear stress is generated at the interface between the aluminum film and the anti-reflective layer.

In addition, the venting process is carried out after the wafer is left as is in the cassette for more than 3 minutes. Thus, the wafer is cooled before the venting process takes place such that the thermal energy supplied is insufficient to produce significant oxidation of the aluminum film. Accordingly, an excellent adhesion can be secured between the aluminum film and the anti-reflective layer. This, in addition to a further reduction in the thermal stress in the aluminum layer, prevents a ball defect from occurring at the interface between the aluminum film and the anti-reflective layer.

BRIEF DESCRIPTION OF THE DRAWINGS

The above and other objects, features and advantages of the present invention will become more apparent form the following detailed description of the preferred embodiments thereof made with reference to the attached drawings, of which.

DETAILED DESCRIPTION OF THE PREFERRED EMBODIMENTS

Hereinafter, preferred embodiments of the present invention will be described in detail with reference to FIGS. 3A to 3C, 4 and 5.

Figure 3A:
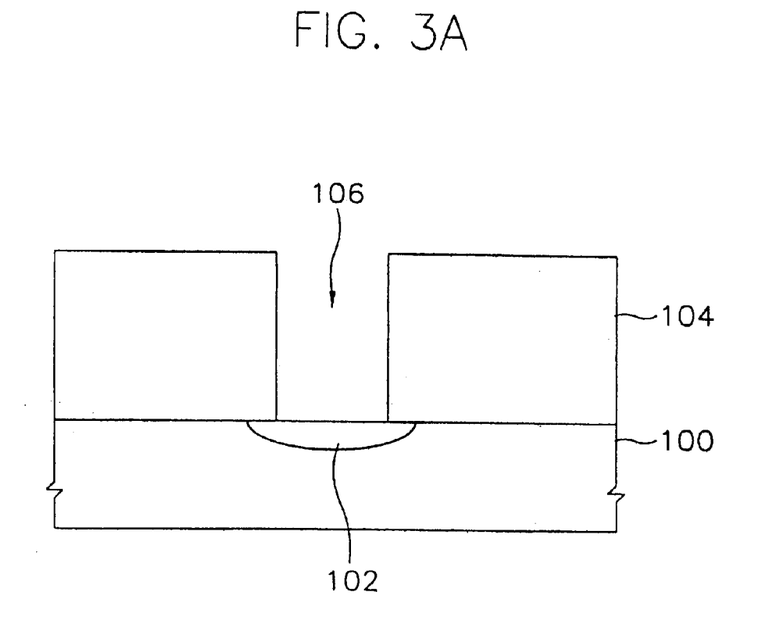
FIGS. 3A to 3C are sectional views of a wafer showing a method of manufacturing a semiconductor device according to the present invention.

Referring first to FIG. 3A, silicon oxide is deposited on a semiconductor substrate 100 on which devices such as a transistor are formed, thereby forming an insulating interlayer 104. Then, the insulating interlayer 104 is partially etched using a photolithography process to thereby form a contact hole 106 or a via hole that exposes a conductive area of the semiconductor substrate 100, such as an active area or a lower metal wiring.

Figure 3B:
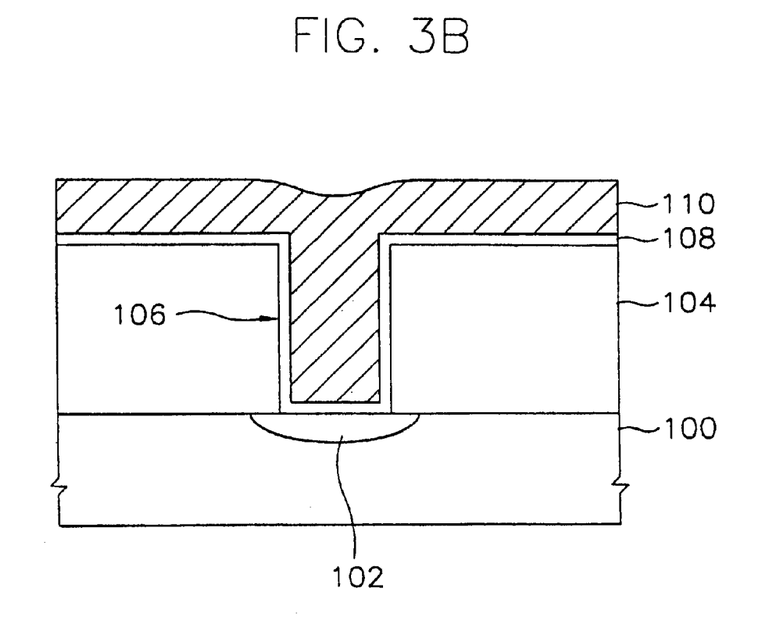
Figure 4:
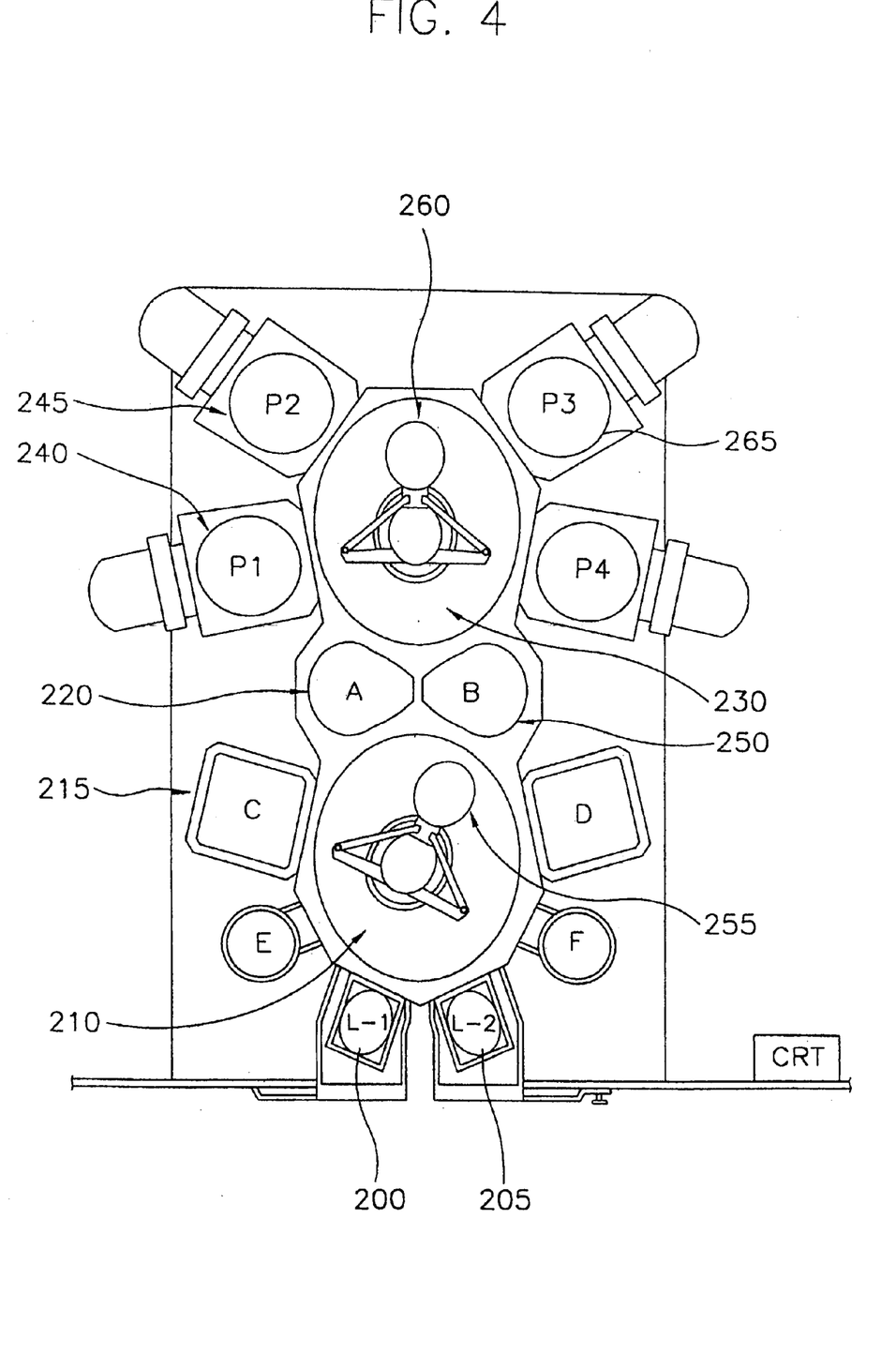
FIG. 4 is a schematic diagram of a physical vapor deposition apparatus for performing the method according to the present invention.

Referring to FIGS. 3B and 4, after loading the semiconductor substrate 100 into a cassette of a loadlock chamber 200 of a physical vapor deposition (PVD) apparatus, the pressure in the loadlock chamber 200 is lowered by a pump so that the interior of the loadlock chamber 200 assumes a vacuum state.

Then, the substrate 200 in the loadlock chamber 200 is conveyed into a buffer chamber 210 by a first robot arm 255.

Subsequently, the substrate 100 is conveyed into an RF etching chamber 215. The buffer chamber 210 prevents vacuum loss when the wafer is conveyed. An RF plasma etching process is performed in the RF etching chamber 215 to remove a natural oxide film, which is formed on the bottom of the contact hole 106 or the via hole. About 400 Å material is removed in this etching process.

Then, the first robot arm 255 moves the semiconductor substrate 100 from the RF etching chamber 215 to a cleaning chamber 220. After the substrate is cleaned in the cleaning chamber 220, the semiconductor substrate 100 is conveyed into a first reaction chamber 240 by a second robot arm 260 disposed in a transfer chamber 230.

In the first reaction chamber 240, a barrier metal, such as titanium, is sputtered onto the semiconductor substrate 100 to a thickness of about 300 Å at a deposition temperature of 100° C. to form a barrier metal layer 108. In addition, after the semiconductor substrate 100 has been transferred into a second reaction chamber 245 by the second robot arm 260, an aluminum film 110 is formed on the barrier metal layer 108 by sputtering. The aluminum film 110 has a thickness of about 8000 Å. Preferably, the aluminum film 110 comprises an aluminum alloy containing 0.2% silicon and 0.5% copper.

Then, after the substrate 100 has been transferred into a third reaction chamber 265, an aluminum reflow process is carried out at a temperature about 540° C. so that the contact hole 106 or the via hole is completely buried without creating a void in the aluminum layer 110. At this time, titanium alumide (TiAl$_3$) crystals are created due to the reaction between the aluminum and the titanium (Ti) of the barrier metal layer 108. Titanium alumide has a hardness and melting point higher than those of aluminum. Hence, the thermal stability of the titanium alumide is excellent.

Once the aluminum reflow process has been completed, a slit valve (not shown) formed between the transfer chamber 230 and the third reaction chamber 265 is opened, and the second robot arm 260 in the transfer chamber 230 moves the semiconductor substrate into a cooling chamber 250.

Figure 5:
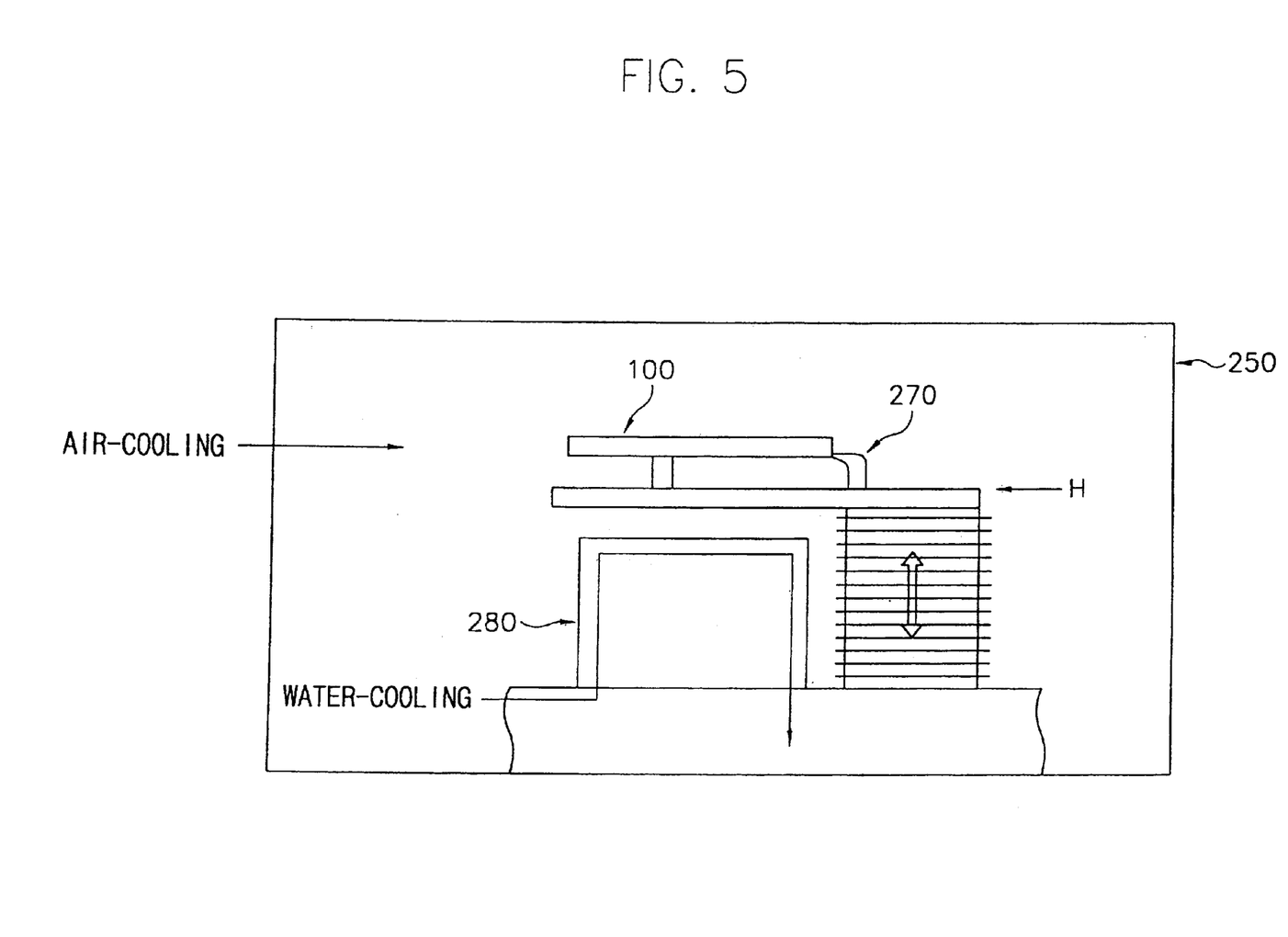
FIG. 5 is an enlarged sectional view of a cooling chamber of the physical vapor deposition apparatus shown in FIG. 4.

FIG. 5 shows the cooling chamber 250. Reference numerals 270 and 280 designate a finger for picking up the substrate 100 and a pedestal for supporting the substrate 100, respectively.

Referring to FIG. 5, the semiconductor substrate 100, which has undergone the aluminum reflow process, is set at a raised position H in the cooling chamber 250. There, the semiconductor substrate 100 is left as is for 110 seconds. Then, cooling water and a cooling gas, such as argon (Ar), are injected into the cooling chamber 250 to simultaneously carry out water-cooling and air-cooling processes of forcibly cooling the aluminum film 110 for 25 seconds. Accordingly, the aluminum film 110 is slowly cooled for 135 seconds. When the aluminum film 110 is slowly cooled, the thermal stress caused by the difference in thermal expansion between the aluminum film 110 and the underlying layer is relieved. Accordingly, the TiN anti-reflective layer is formed and the succeeding thermal process is carried out in a state in which the aluminum film is under little stress. Accordingly, ball defects are prevented from occurring.

As discussed above, the rate at which the wafer cools depends on the thermal conductivity of the cassette. Therefore, the step of slow-cooling the aluminum layer can tailored to the material of the cassette of the loadlock chamber. For example, when the cassette is of a material such as a PBT having a thermal conductivity of more than 0.3° C./min, the substrate 100 cools rapidly after it has been returned to the cassette and the venting process is being carried out. In this case, the rate at which the substrate 100 cools has to be decreased so that the stress of the aluminum film can be sufficiently relieved. To this end, the water-cooling and air-cooling processes are preferably carried out for more than 100 seconds. On the contrary, when the cassette is of a material such as PP having a thermal conductivity of less than 0.3° C./min, the wafer cools slowly due to the low thermal conductivity of the cassette. In this case, the cooling water and cooling gas can be supplied into the cooling chamber 250 just after the substrate 100 has been transferred into the cooling chamber 250.

When the forced cooling process is finished, the substrate 100 is transferred into a loadlock chamber 205 by the first robot arm 255. Then, after the 25 or 26 sheets of wafers (one lot) are returned to the cassette of the loadlock chamber 205, the substrates 100 are left as is for more than 3 minutes. After that, a vent gas, such as N$_2$ or Ar, is supplied into the loadlock chamber 205 through a vent line (not shown) connected to the loadlock chamber 205 until the pressure of the loadlock chamber 205 reaches 760 Torr. Once the loadlock chamber 205 has been so vented, the substrates 100 are unloaded from the cassette.

As described earlier, in the conventional method, a ball defect was created in the wafer transferred into the last slot of either a PP or PBT cassette. That is, the venting process of injecting N$_2$ or Ar into the loadlock chamber was carried out when the temperature of the last wafer returned to the cassette is about 100° C. Therefore, the wafer returned to the last slot cooled rapidly compared with the other wafers, whereby a ball defect was created. In addition, when the venting process was carried out, the temperature condition and atmosphere in the loadlock chamber facilitated an oxidization of the aluminum film. Therefore, the adhesion between the aluminum film and the subsequently formed TiN anti-reflective layer was poor.

However, according to the present invention, a time delay of more than 3 minutes is provided before the venting process is carried out. Therefore, the wafer transferred into the last slot is slowly cooled so that the stress thereof is relieved, thereby minimizing the shear stress generated during the succeeding thermal cycle process. In addition, only a small amount of the thermal energy required for oxidizing the aluminum film is supplied because the wafer is cooled during the time delay. As a result, a strong adhesive force can be secured between the aluminum film and the TiN anti-reflective layer.

Figure 3C:
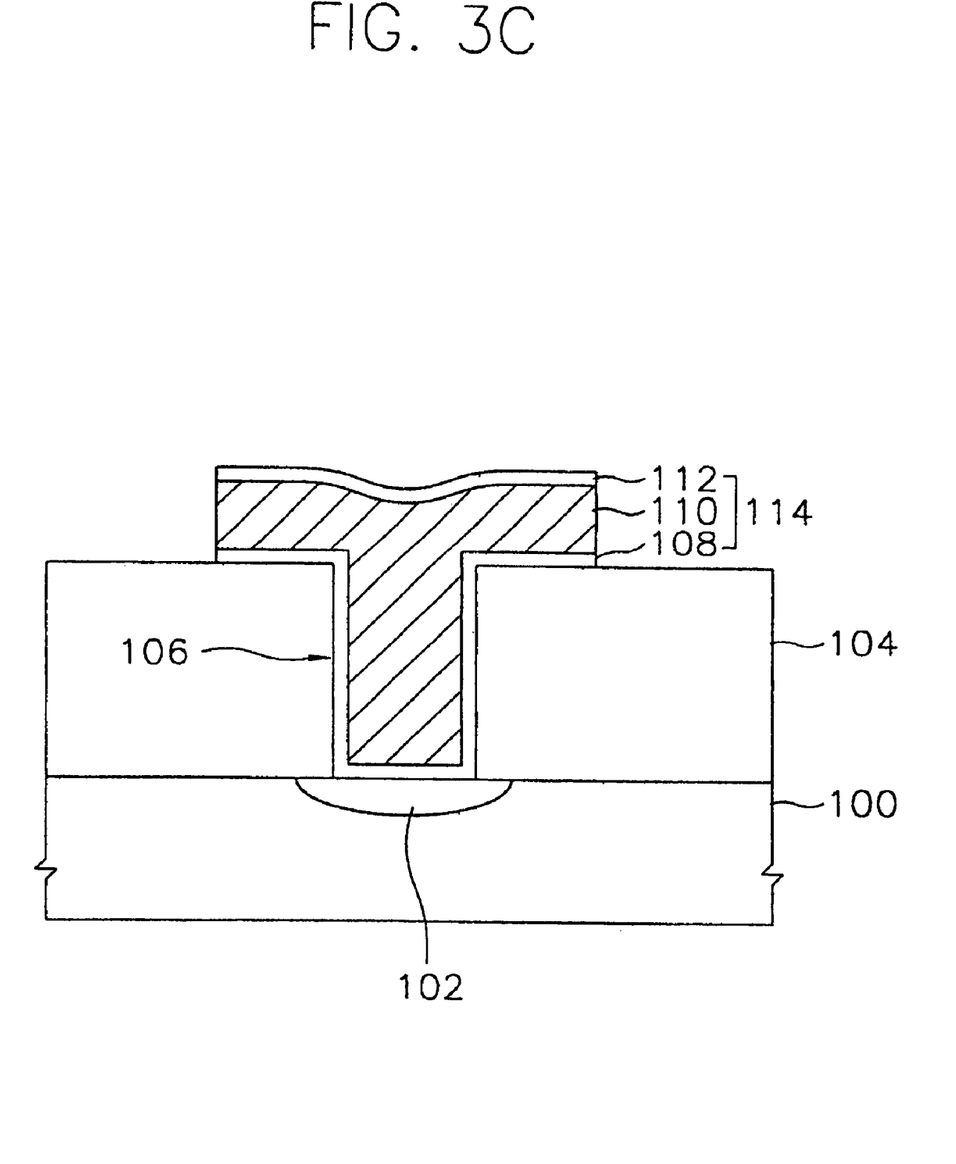

Referring to FIG. 3C, once the aluminum deposition process has been finished, the anti-reflective layer 112 comprising titanium nitride is formed on the aluminum film 110 (in another piece of deposition equipment). Then, the anti-reflective layer 112, the aluminum film 110 and the barrier metal layer 108 are patterned using a photolithography process, whereby a metal wiring 114 is formed.

Figure 6:
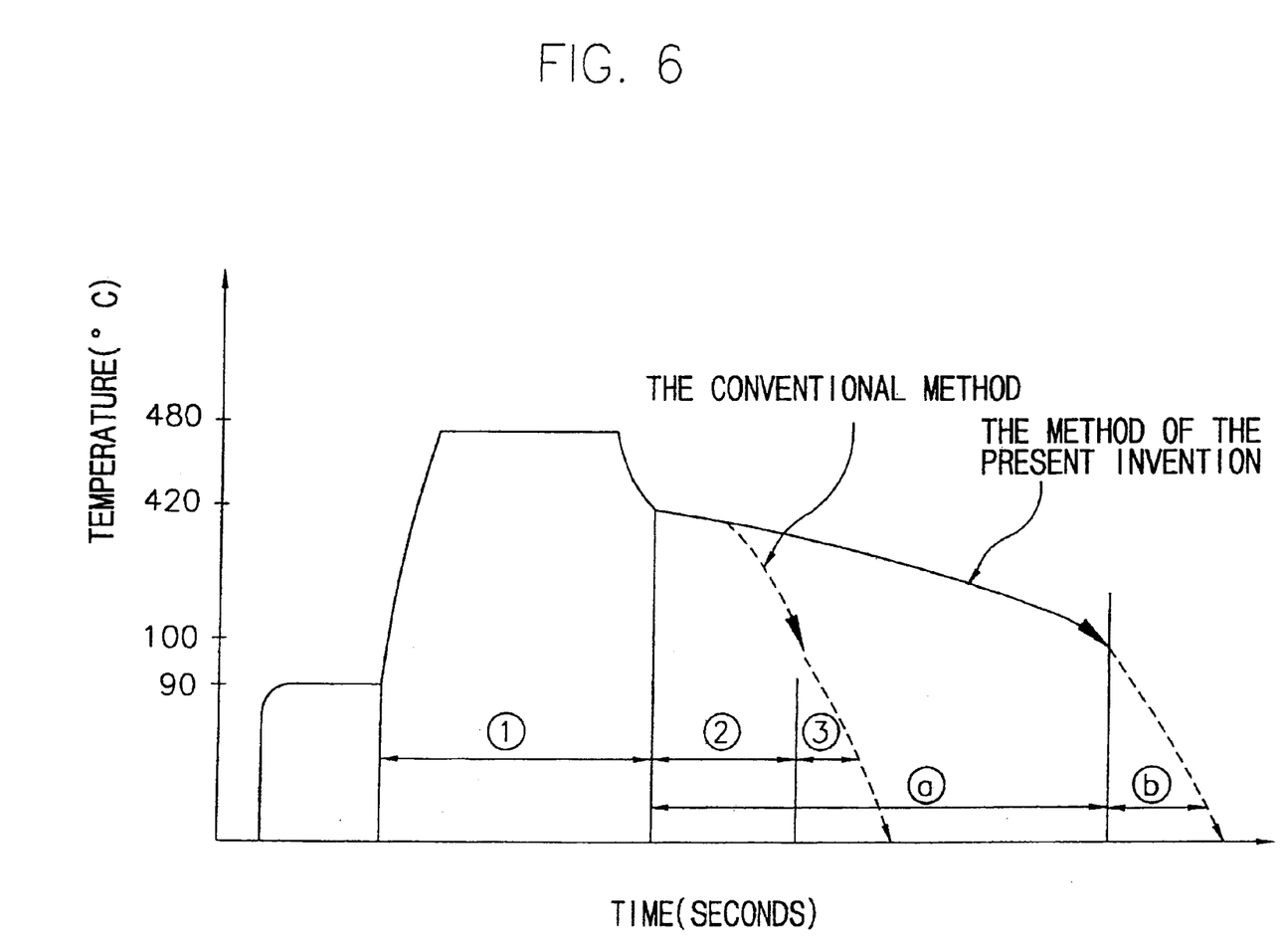
FIG. 6 is a graph showing the temperature variation as a function of time when an aluminum film is formed according to the conventional method and according to the method of the present invention, respectively.

FIG. 6 shows the temperature variation as a function of time when the aluminum film is formed according to the conventional method and according to the method of the present invention, respectively. In the conventional aluminum deposition method, after the aluminum is deposited onto the substrate at the usual deposition temperature, the temperature is raised to 540° C. to effect the aluminum reflow process (area (①)). Then, the water-cooling and the air-cooling are simultaneously carried out in the cooling chamber for 70 seconds, thereby cooling the aluminum film to about 100° C. (area (②)). After that, the venting process is carried out so that the substrate, that is, the wafer, can be unloaded (area (③)).

According to the aluminum deposition method of the present invention, after the aluminum is deposited onto the substrate (at the deposition temperature typical for the process employed), the temperature is raised to 540° C. to effect the aluminum reflow process (area ①), similarly to the conventional method. However, in contrast to the conventional method, the substrate having the aluminum film thereon is then left as is for 110 seconds in a raised position in the cooling chamber. After that, the water-cooling and the air-cooling processes are simultaneously carried out for 25 seconds. Hence, the aluminum film cools to a temperature of about 100° C. at a much slower rate than in the conventional method (area ⓐ). In this respect, the total cooling time for the aluminum film is about 135 seconds. Also, as a result, the annealing of the aluminum film in the temperature range of about 300 to 400° C. occurs for 110 seconds. Hence, a great amount of $TiAl_3$ crystals are created at the interface between the aluminum film and the underlying titanium barrier metal layer. $TiAl_3$ has a coefficient of thermal expansion in between the coefficients of thermal expansion of the aluminum film and the silicon oxide of the insulating interlayer and thus, acts as a buffer layer for reducing the thermal stress which would otherwise arise when the cooling process is carried out. In addition, $TiAl_3$ is harder than aluminum. Therefore, the $TiAl_3$ minimizes the shear stress generated at the interface between the aluminum film and the TiN anti-reflective layer formed thereon by restraining the plastic deformation of the aluminum film.

Subsequently, the substrate is left as is for 3 minutes in the loadlock chamber. Then, the venting process is carried out and the substrate is unloaded (area ⓑ).

According to the conventional method, the surface of the aluminum film of the wafer transferred to the last slot of the cassette in the load lock chamber is oxidized considerably when the venting process is carried out. Therefore, sufficient adhesion may not be secured between the aluminum film and the TiN anti-reflective layer that is subsequently formed thereon. On the other hand, the present invention provides a time delay of about 3 minutes before the venting process is carried out. Thus, the wafer transferred to the last slot is cooled during the delay time such that comparatively little of the thermal energy required for oxidizing the aluminum film is generated. Therefore, the oxidation of the surface of the aluminum film is suppressed, whereby a strong adhesive force can be secured between the aluminum film and the TiN anti-reflective layer subsequently formed thereon. Moreover, stress in the aluminum film is relieved by slowly cooling the film from the reflow process temperature (of about 540° C.) to the normal temperature (of about 100° C., i.e., approximately that of the deposition temperature).

Figure 7:
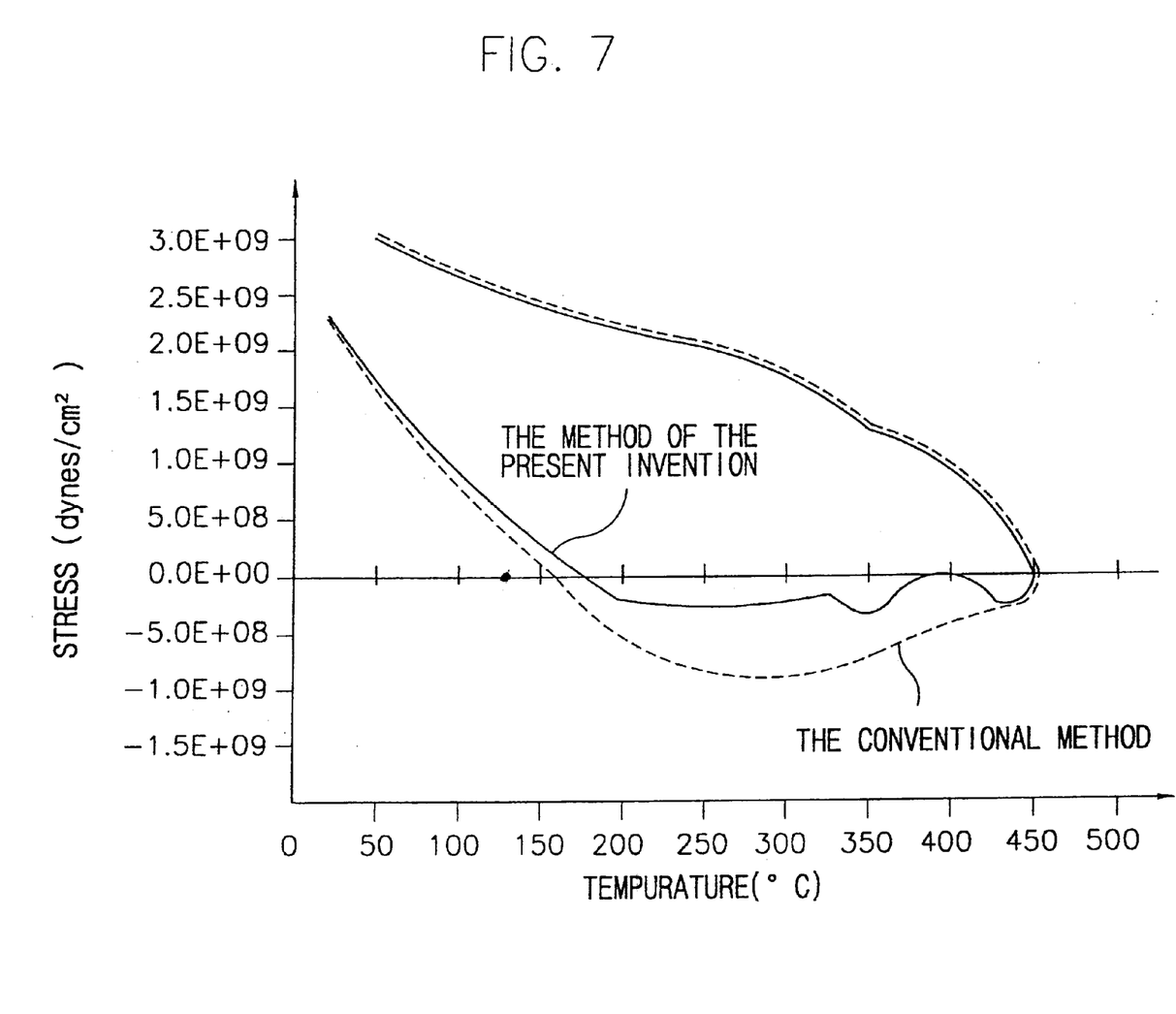
FIG. 7 is a graph showing the hysteresis curve when the aluminum film is cooled according to the conventional method and according to the method of the present invention, respectively.

FIG. 7 shows hysteresis curves for when the aluminum film is cooled according to the conventional method and according to the method of the present invention, respectively, wherein the temperature of the aluminum film is raised to 450° C. after being formed, and the stress applied to the aluminum film is measured in-situ while the temperature thereof is lowered. In FIG. 7, the dotted line shows the results produced using the conventional method, and the solid line shows the results produced using the method of the present invention in which the aluminum film is cooled at a comparatively slower rate.

As shown in FIG. 7, the stress is considerably lower according to the present invention in the temperature range of 200 to 350° C. As described above, a ball defect will be produced at the interface between the aluminum film and the TiN anti-reflective layer when the shear stress of the aluminum layer is excessive. However, according to the present invention, the aluminum film is slowly cooled in such a way as to relieve the stress in the aluminum layer sufficiently to prevent the shear stress from exceeding a critical value. That is, the stress in the aluminum film is relieved regardless of the effect that the thermal conductivity of the material of the cassette has on the wafer. Accordingly, a ball defect is prevented from occurring at the interface between the aluminum layer and the TiN anti-reflective layer.

Finally, although the present invention has been described in detail with reference to the preferred embodiments thereof, various changes, substitutions and alterations, as will be apparent to those of ordinary skill in the art, can be made to the preferred embodiments without departing from the true spirit and scope of the invention as defined by the appended claims.

What is claimed is:

1. A method for use in manufacturing a semiconductor device, the method comprising:

forming an aluminum film on a substrate;

a first cooling process comprising forcibly cooling the aluminum film;

a second cooling process of allowing the aluminum film to cool passively for more than about 3 minutes after the forced cooling of the aluminum film has been completed; and subsequently forming an anti-reflective layer on the aluminum film.

2. The method as claimed in claim 1, wherein said forming of an aluminum film comprises forming a film of an aluminum alloy on the substrate.

3. The method as claimed in claim 1, and further comprising heating the aluminum film to reflow the material thereof, before said forced cooling thereof begins.

4. The method as claimed in claim 1, wherein said first cooling process terminates and said second cooling process begins when and the temperature of the substrate is about 100° C.

5. The method as claimed in claim 1, wherein said forming of the anti-reflective layer comprises forming a layer of titanium nitride (TiN) on the aluminum film.

6. A method of forming an aluminum film on a substrate, comprising:

conveying the substrate into a reaction chamber depositing aluminum onto the substrate in the reaction chamber by physical vapor deposition to form an aluminum film on the substrate;

subsequently conveying the substrate from the reaction chamber and into a cooling chamber;

cooling the aluminum film in the cooling chamber;

subsequently conveying the substrate into a cassette in a loadlock chamber;

once the substrate has been conveyed into the cassette, leaving the substrate as is in the cassette for a period of time of more than about 3 minutes such that the aluminum film is allowed to cool; and after said period of time of more than about 3 minutes has elapsed, venting the loadlock chamber to raise the pressure in the loadlock chamber by injecting a vent gas into the loadlock chamber while the substrate is in the cassette, and unloading the substrate from the loadlock chamber.

7. The method as claimed in claim 6, wherein the cassette is of a material having a thermal conductivity greater than 0.3° C./min, and said cooling of the aluminum film in the cooling chamber comprises allowing the aluminum film to cool passively in the cooling chamber for a predetermined period of time, and subsequently forcibly cooling the aluminum film in the cooling chamber by injecting at least one cooling medium into the chamber.

8. The method as claimed in claim 7, wherein the cassette comprises polybutylene terephtalate (PBT).

9. The method as claimed in claim 7, wherein said predetermined period of time is more than about 100 seconds, and said forced cooling comprises injecting cooling water and a cooling gas into the cooling chamber.

10. The method as claimed in claim 6, wherein the cassette is of a material having a thermal conductivity below 0.3° C./min., and said cooling of the aluminum film in the cooling chamber comprises forcibly cooling the aluminum film in the cooling chamber by injecting at least one cooling medium into the chamber.

11. The method as claimed in claim 10, wherein the cassette comprises polypropylene (PP).

12. The method as claimed in claim 10, wherein said forced cooling comprises injecting cooling water and a cooling gas into the cooling chamber.

13. The method as claimed in claim 6, wherein said cooling of the aluminum film in the cooling chamber comprises cooling the substrate to a temperature of about 100° C. just before the substrate is conveyed into the cassette in the loadlock chamber.

14. The method as claimed in claim 6, wherein the vent gas is an inert gas.

15. The method as claimed in claim 6, and further heating the aluminum film on the substrate to a temperature that causes the aluminum film to reflow, before the substrate is conveyed into the cooling chamber.

16. The method as claimed in claim 15, wherein said cooling of the aluminum film in the cooling chamber comprises cooling the substrate to a temperature of about 100° C. just before the substrate is conveyed into the cassette in the loadlock chamber.

17. The method as claimed in claim 16, wherein said cooling of the aluminum film in the cooling chamber is carried out for about 135 seconds.

18. A method of forming a wiring pattern on a semiconductor substrate, said method comprising:

conveying a substrate into a reaction chamber;

depositing aluminum onto the substrate in the reaction chamber by physical vapor deposition to form an aluminum film on the substrate;

subsequently conveying the substrate into a cooling chamber;

cooling the aluminum film in the cooling chamber;

subsequently conveying the substrate into a cassette in a loadlock chamber;

once the substrate has been conveyed into the cassette, leaving the substrate as is in the cassette for a period of time of more than about 3 minutes such that the aluminum film is allowed to cool;

after said period of time of more than about 3 minutes has elapsed, venting the loadlock chamber to raise the pressure in the loadlock chamber by injecting a vent gas into the loadlock chamber while the substrate is in the cassette, and unloading the substrate from the loadlock chamber;

subsequently forming an anti-reflective layer on the aluminum film; and patterning the anti-reflective layer and the aluminum film.

19. The method as claimed in claim 18, wherein said cooling of the aluminum film in the cooling chamber comprises allowing the aluminum fill to cool passively in the cooling chamber for a predetermined period of time, and subsequently forcibly cooling the aluminum film in the cooling chamber by injecting at least one cooling medium into the chamber.

20. The method as claimed in claim 19, wherein said predetermined period of time is more than about 100 seconds.

21. The method as claimed in claim 20, wherein said cooling of the aluminum film in the cooling chamber comprises cooling the substrate to a temperature of about 100° C. just before the substrate is conveyed into the cassette in the loadlock chamber.

22. The method as claimed in claim 21, wherein the substrate conveyed into the reaction chamber has an insulating layer thereon and a contact hole or via in the insulating layer, and further comprising heating the aluminum layer to a temperature that causes the aluminum to reflow and thereby bury the contact hole or via.

23. The method as claimed in claim 22, wherein the substrate conveyed into the reaction chamber has a barrier metal layer of titanium disposed over the insulating layer, said heating of the aluminum comprises heating the aluminum film to a temperature of about 540° C., and said cooling of the aluminum film in the cooling chamber is carried out for a total time of about 135 seconds.

\* \* \* \* \*